United States Patent
Boggs et al.

[11] Patent Number: 6,094,079
[45] Date of Patent: Jul. 25, 2000

[54] SEQUENCER MODULE FOR A PULSE WIDTH MODULATION DRIVER

[75] Inventors: Brian L. Boggs, East Peoria; Paul C. Gottshall, Washington; Steven O. Hart, Morton; Brian G. McGee, Chillicothe, all of Ill.

[73] Assignee: Caterpillar Inc., Peoria, Ill.

[21] Appl. No.: 09/216,902

[22] Filed: Dec. 21, 1998

[51] Int. Cl.[7] .................................................. H03K 3/017
[52] U.S. Cl. ............................................ 327/172; 327/110
[58] Field of Search ...................................... 327/108, 110, 327/172–177; 363/26, 41

[56] References Cited

U.S. PATENT DOCUMENTS

| | | | |
|---|---|---|---|
| 4,357,572 | 11/1982 | Andersen et al. | 323/286 |
| 4,825,347 | 4/1989 | Guerrera et al. | 363/41 |
| 4,827,391 | 5/1989 | Sills | 363/41 |
| 4,972,130 | 11/1990 | Rossi et al. | 318/293 |
| 5,400,236 | 3/1995 | Shimizu et al. | 363/37 |
| 5,550,498 | 8/1996 | Kwan et al. | 327/175 |
| 5,721,511 | 2/1998 | Lee | 327/540 |
| 5,973,527 | 10/1999 | Schweighofer et al. | 327/172 |
| 6,005,316 | 12/1999 | Harris | 310/90.5 |

*Primary Examiner*—My-Trang Nuton
*Attorney, Agent, or Firm*—Steven G. Kibby

[57] ABSTRACT

A driver for producing a desired pulse width modulated current through a load is provided with a sequencer for generating a plurality of wave forms phase-shifted so as to have non-overlapping duty cycles. A target generator supplies a target current value to a comparator, which compares the target current value to a signal representative of a sensed current flowing through the load. A driver control is responsive to a duty-cycle of only one of the plurality of wave forms to selectively generate trigger signals for switching current through the load in response to the result of the comparison.

9 Claims, 3 Drawing Sheets

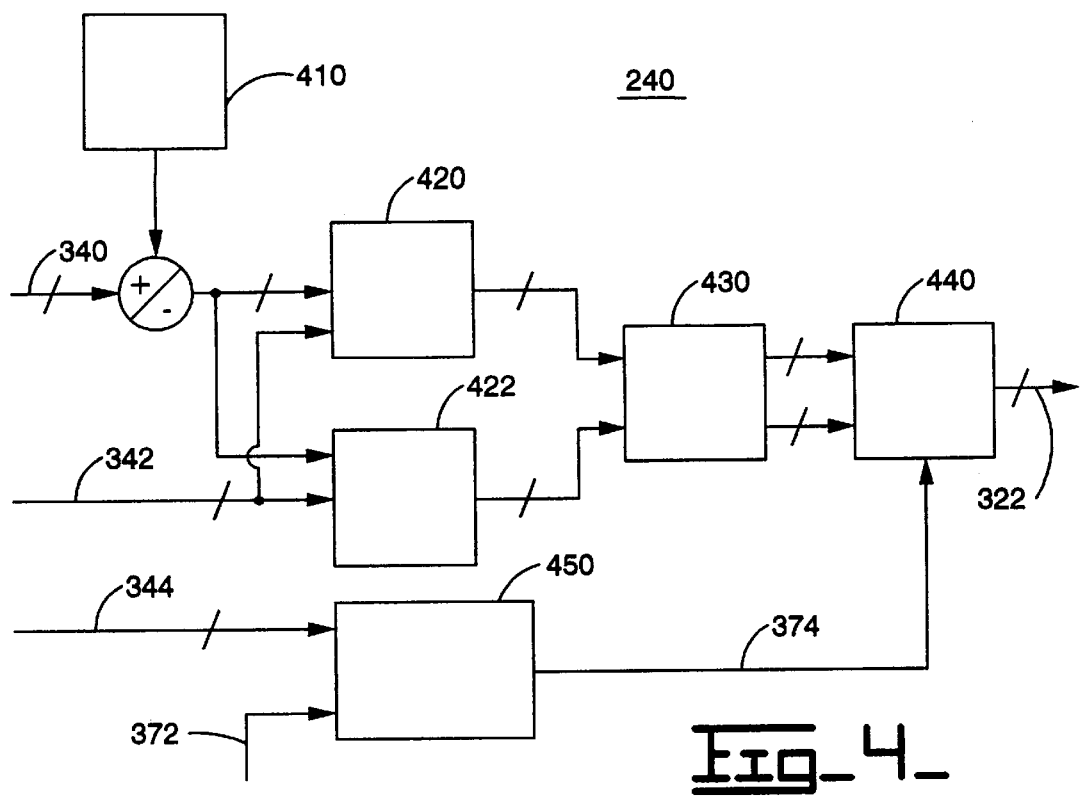
Fig_4_
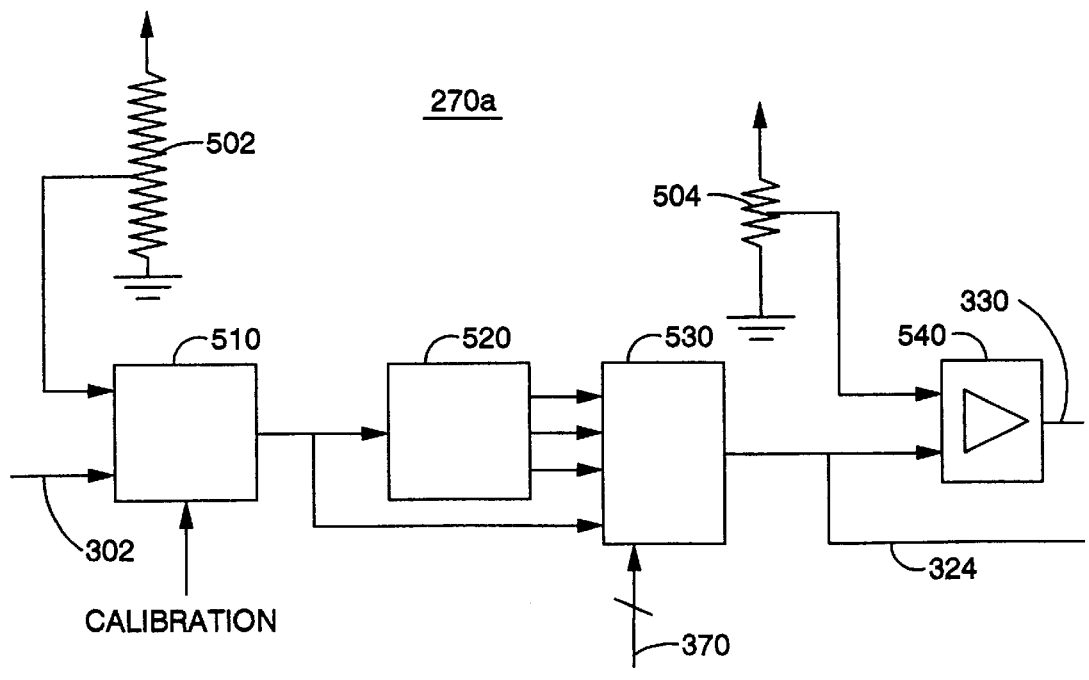
Fig_5_

6,094,079

SEQUENCER MODULE FOR A PULSE WIDTH MODULATION DRIVER

TECHNICAL FIELD

The present invention is directed to a system for maintaining a desired current level through a resistive or inductive load, and more specifically to a sequencer module for providing timing control to a pulse width modulation driver.

BACKGROUND ART

A PWM driver attempts to maintain a desired current level through a load by modulating the duty cycle of a direct current (DC) source being switched at a designated frequency. A PWM driver controller selectively supplies low amperage trigger signals to a switched power circuit, for example to the gate of a N-channel MOSFET transistor electrically connected in series with the load and DC source, such as a battery (BATT). A sensed value representative of the current flowing through the load is in turn fed back to the controller, in order to enable the switch to be turned off when the current is above the desired level and turned on when below the desired level.

One characteristic of a PWM driver is that while current to the load may be switched off at any time, the controller only permits current to be switched on to the load at predetermined intervals. Consequently, the frequency at which electrical current is supplied to the load is relatively constant, while the average current supplied to the load is dependent on the duty cycle or "pulse width" of the time during which the controller keeps the switch on.

Most inductive loads behave best if they are switched at the highest available frequency, because there is less "ripple" as the current rises and falls during successive on/off periods. It is important however, to minimize electromagnetic interference (EMI) introduced by current spikes on the battery line. Such spikes are created by a flyback diode included in the external driver circuit to recover energy when the inductor is disconnected from battery. It is particularly important to minimize flyback spikes when multiple PWM drivers share common battery lines, to avoid corrupting the feedback signals used by the other PWM driver controls in determining whether to turn on.

The present invention is directed to overcoming one or more of the disadvantages set forth above.

DISCLOSURE OF THE INVENTION

According to one aspect of the present invention, a driver for producing a desired pulse width modulated current through a load is provided with a sequencer for generating a plurality of wave forms phase-shifted so as to have non-overlapping duty cycles. A target generator supplies a target current value to a comparator, which compares the target current value to a signal representative of a sensed current flowing through the load. A driver control is responsive to a duty-cycle of only one of the plurality of wave forms to selectively generate trigger signals for switching current through the load in response to the result of the comparison.

According to another aspect of the invention, an integrated circuit is provided having a plurality of pulse width modulation drivers, each driver having a target generator, a comparator, and a driver control for selectively generating trigger signals to switch current through the load. The integrated circuit is also provided with a sequencer for generating a plurality of wave forms phase-shifted so as to have non-overlapping duty cycles. Current spikes are minimized because each PWM driver control is responsive to a duty-cycles of only one of the plurality of wave forms to generate the trigger signals, preventing two drivers from turning on at the same time.

A more complete appreciation of the invention will become apparent by reference to the following detailed description of certain present preferred embodiments thereof and certain present preferred methods of practicing the same, in conjunction with the accompanying drawings in which like reference symbols indicate the same or similar components.

BRIEF DESCRIPTION OF THE DRAWINGS

FIG. 4 is a schematic illustration of a target generator module.

FIG. 5 is a schematic illustration of scaling block and load short detection elements.

BEST MODE FOR CARRYING OUT THE INVENTION

Figure 1:
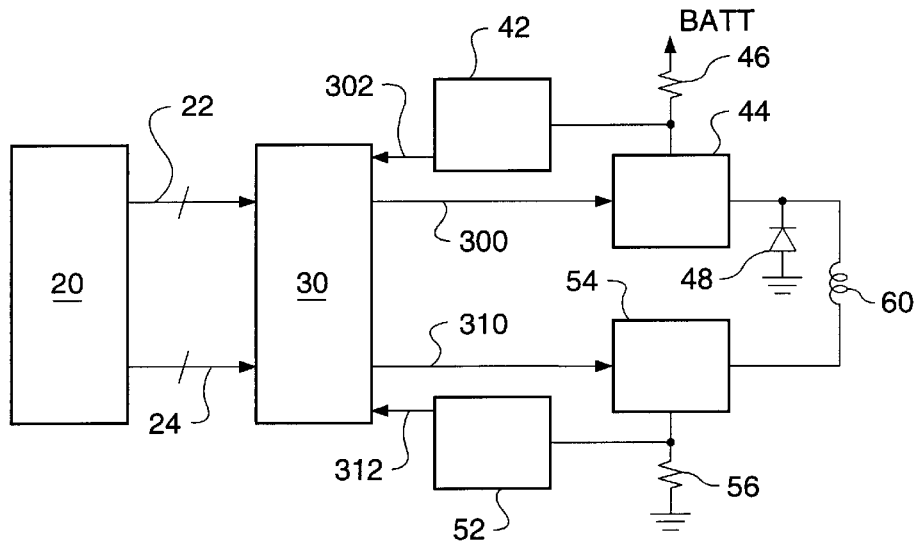
FIG. 1 illustrates a programmable PWM driver control according to the present invention, in combination with a microprocessor, power circuit and load.

Turning first to FIG. 1, a microprocessor 20 is in periodic communication with the PWM driver controller 30 via a data bus 24 and a plurality of control signal lines 22. The microprocessor 20 preferably supplies to the controller 30 ten bit data words, representing respectively a desired load current, dither half-frequency and half-amplitude, and one or more control signal words. The words are stored within memory registers (not shown) in controller 30, which thereafter autonomously modulates switches 44 and/or 54 to supply current to the load 60. Once an initialization routine has been run to enable the controller 30, PWM current control continues until microprocessor 20 overwrites one or more of the registers with new data, or a fault is detected, as described hereinafter.

For purposes of illustration, the present invention is shown in FIG. 1 as a single PWM controller 30 in communication with switches 44 and 54 on the high (BATT) and low (ground) sides of the load through modulation enable (MOD) and diagnostic enable lines 300 and 312, respectively. Controller 30 also receives modulate and diagnostic feedback voltages using current mirrors 42,52 and current sense resistors 46,56, which are representative of the amount of current flowing though the load 60. It should be understood that the selection of the high side terminal as the modulation terminal, and the use of two switches and two current mirrors is merely illustrative, and does not form part of the present invention. In the present preferred mode contemplated by Applicants, four controllers 30 are combined on a single application specific integrated circuit, and different resistive and/or inductive loads can be connected to each.

A flyback diode 48 grounds the switched terminal of load 60 in order to recover stored energy when the battery BATT is disconnected by switch 44.

In the disclosed embodiment, PWM driver control is based upon peak current levels, although the load may still respond to a lower RMS current since the switching frequency is so fast that an actuator does not appreciably move as a result of current ripple. There are preferably at least four user selectable switching frequencies, corresponding to divided clock CLK input frequencies CLK/800, CLK/1600, CLK/3200, and CLK/6400. For a sixteen megahertz clock input, the switching frequency is selectable between two and one half and twenty kilohertz, or as often as every fifty microseconds, making the peak and RMS current values very close to one another. This permits current control to within three percent of full scale, because the difference is programmable and linear and consequently correctable by offsetting the target current value. Accordingly, by providing a suitable offset map, the present peak current control may be configured as a load independent average current controller.

Figure 2:
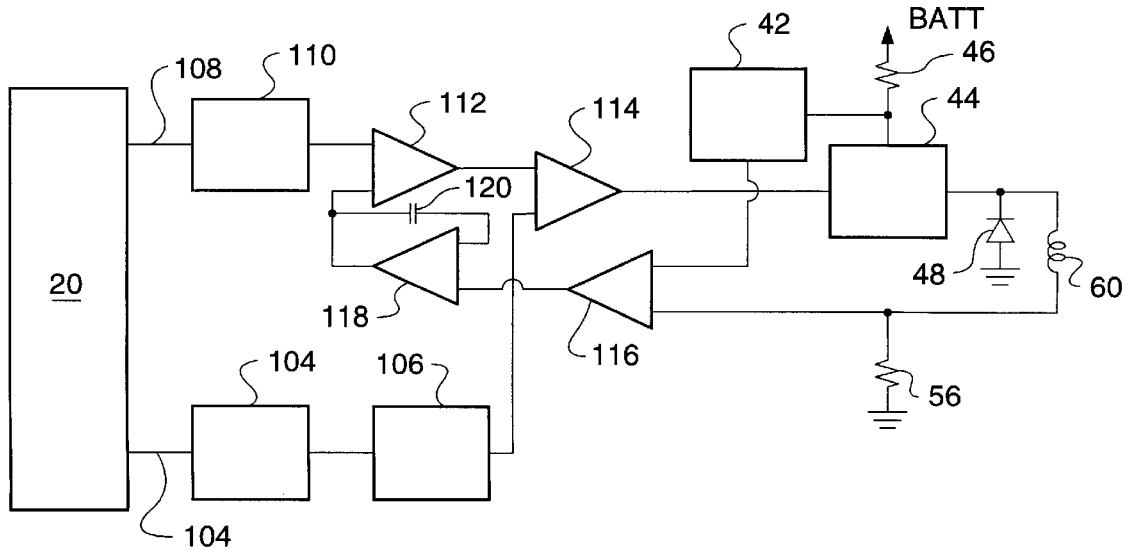
FIG. 2 schematically illustrates a conventional average current controlled pulse width modulation driver.

By contrast, FIG. 2 schematically shows a PWM driver system configured for conventional average current control, in order to better illustrate the advantages of the present invention. A microprocessor 20 generates a switching frequency control signal on input line 102, which is supplied as an analog voltage level to voltage controlled oscillator 106 by low pass filter 104 for generating a triangular wave form having a frequency proportional to the duty cycle of signal 102. Similarly, a target current control signal on input line 108 generated by microprocessor 20 is supplied as a target reference voltage level $V_{REF}$ to a differential amplifier 112 by low pass filter 110. An error signal $V_{ERR}$ corresponding to the difference between $V_{REF}$ and an output feedback voltage level $V_{OF}$ representative of the current flowing through the load is supplied by differential amplifier 112 to differential amplifier 114.

The error signal $V_{ERR}$ is continuously compared to the triangular wave form F having a desired duty cycle in amplifier 114, in order to supply a trigger signal to activate switch 44 during a specified portion of the duty cycle wherein $V_{ERR}$ exceeds the instantaneous value of wave form F. In the circuit illustrated in FIG. 2, the feedback voltage $V_{OF}$ supplied to differential amplifier 112 is generated by integrating through an operational amplifier 118 tied to zero, voltage levels measured at the high and low voltage sides of the load combined by summing amplifier 116. The integrated feedback voltage signal has a large phase lag however, making the driver unable to respond quickly to large changes in the load current and potentially permitting the load or driver circuits to be damaged.

Figure 3:
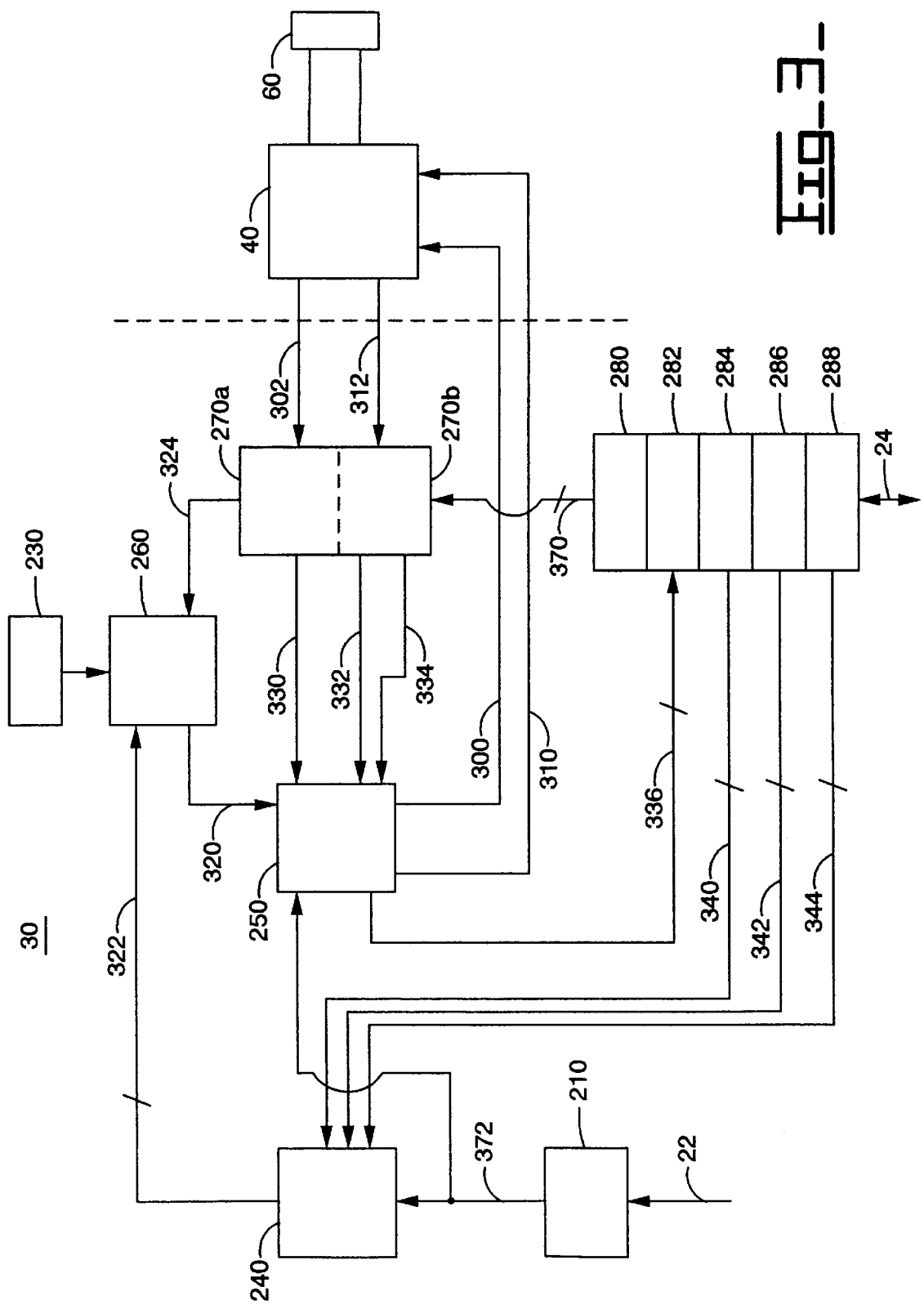
FIG. 3 is a schematic illustration of a programmable PWM driver control, power circuitry, and a load.

FIG. 3 shows a block diagram of a PWM driver controller 30 according to one embodiment of the present invention, along with external power circuitry 40 and a load 60 not forming part of the invention. The microprocessor 20 writes peak current target, current dither half frequency and current dither half amplitude over the parallel data bus 24 into registers 284,286,288 associated with the target generator module 240 according to a stored program by supplying appropriate data, address, and chip select signals.

Turning briefly to FIG. 4, the target generator 240 adds and subtracts in elements 420 and 422 respectively, any programmed dither half amplitude digital value received on line 342, from the sum of the desired peak current target received on line 340 and any calibration offset stored in an offset latch 410. Any programmed dither half frequency value received on line 344 is loaded into a counter 450 connected to a multiplexer 440, in order to generate a square wave target wave form by alternately toggling between the two values at the end of each count period. The counter is driven by a clock signal 372 received from sequencer 210.

Symmetry checker subcircuit 430 continually determines whether or not the specified dither amplitude can be centered upon the peak current target. This is important because at either end of the current range, if the square wave height is not twice the dither amplitude and centered on the target, the RMS current will deviate from linearity and result in non-linear movement of the actuator. The target generator continually checks the symmetry of the combined target wave form and automatically attenuates the dither amplitude to a point where it will remain centered. This feature eliminates any need to program the microprocessor to look for such asymmetry or compensate though selection of different dither command values near the extremes of the current range.

Returning to FIG. 3, the instantaneous value of the square wave is simply a digital number which is double buffered and presented to a comparator 260 having a DAC on line 322, for comparing the value to a scaled modulation feedback signal 324. If a zero (0) dither frequency or amplitude is selected, the target generator simply produces a signal s corresponding to peak current target plus calibration offset, if any. Comparator 260 provides the result of any comparison between the target current and the scaled modulation feedback from line 324 to the driver control module on line 320. The driver control module selectively provides modulation and diagnostic enable signals to the high side and/or low side switches 44,54 of the external power circuitry 40 based on the result of the comparison. Modulation scale block 270a and diagnostic scale block 270b provide selectable is gain multipliers for the modulation 302 and diagnostic 312 feedback lines.

FIG. 5 illustrates modulation feedback block 270a. A multiplexer 510 selects between the modulation feedback line 302 and a reference voltage produced by a voltage splitter 502, based upon a calibration control signal. Assuming the modulation feedback is selected, a gain block 520 multiplies the signal by a plurality of different gain multipliers, and either the original or scaled signal is output by multiplexer 530 on line 324 to the comparator 260. The gain register 280 stores a digital value which is supplied to multiplexer 530 on line 370 to select the desired gain multiplier.

Additionally, the PWM driver control 30 may have diagnostic capabilities capable of detecting short circuit or open circuit conditions and disabling the external power circuit 40, as well as storing a diagnostic code which can be read by the microprocessor 20. There are a number of different electrical faults which the control can diagnose and flag. For example, a low side short to battery can be identified by comparison of the scaled modulation signal produced on line 324 in element 540 to a reference voltage produced by a voltage splitter 504. If the scaled modulation signal exceeds the reference voltage, a short circuit detection signal will be generated to the driver control 250 over line 330 and handled as described hereinafter. If a short circuit condition is detected, the controller immediately shuts off all output driver channels by controlling the enable pins, generates an interrupt to the microprocessor, and flags the information in a short circuit bit of a diagnostic register 282.

According to the present invention, a plurality of PWM drivers, are combined under the sequential control of a single state machine. That is, a sequencer module 210 generates wave forms phase shifted so as to have non-overlapping duty cycles over four different channels, to prevent any two channels from turning on at the same time and generating a voltage spike. While all four channels share the same switching frequency, each controller has to wait a staggered amount of time to turn on, although each can turn off at any time. For a 16 MHz clock input, the start times are separated by 8 microseconds, or basically 8% of the cycle of the total separation. Each PWM has a driver control as previously described herein, each driver control being responsive to a different one of the plurality of wave forms so at generate the trigger signal to switch current though the load during a duty cycle for one of the wave forms.

On initial power-up, the reset pin is low and the PWM driver control 30 powers up in a safe state. All the registers or flip-flops are zeroed, and a power-up sequence must be completed before current will be supplied to the external load. There is a control register 280 with four bits (ten bit register) that enables a driver channel to be turned on, two upper bits in the dither amplitude register for each channel force the driver control module 250 to latch any external driver enable pins low in a (00) state or enable external drive circuitry to be turned on when in either a (01) or a (11) state. Also, unless a non-zero value is written into the peak current target register 284, the control module 250 automatically overrides everything and shuts off any external drive circuitry, ensuring that the PWM driver will never run away.

INDUSTRIAL APPLICABILITY

The operation of the present invention is best described in relation to its use in controlling a variety of inductive and/or resistive loads. For example, microprocessor 20 may be an engine control module (ECM) configured to control a variety of highly inductive solenoid operated valves, as well as primarily resistive loads such as fans and warning lights. By connecting the ECM data bus to any number of PWM driver controls taught by the present invention, along with appropriate combinations of address read/write, and clock lines, the microprocessor essentially "sees" only a series of contiguous memory addresses. Once the PWM driver control is set up by a short initialization routine, it will run on its own until a new command is input, freeing the microprocessor to perform other functions.

While certain present preferred embodiments of the invention and certain present preferred methods of practicing the same have been illustrated and described herein, it is to be distinctly understood that the invention is not limited thereto but may be otherwise variously embodied and practiced within the scope of the following claims.

What is claim is:

1. A driver for producing a desired pulse width modulated current through a load, comprising:
    a target generator for supplying a target current value;
    a comparator for comparing said target current value to a signal representative of a sensed current flowing through the load;
    a sequencer for generating a plurality of wave forms phase-shifted so as to have non-overlapping duty cycles; and
    a driver control for selectively generating trigger signals to switch current through the load in response to the result of said comparison, wherein said driver control is responsive to a duty-cycle of only one of said plurality of wave forms to generate said trigger signals.

2. The driver of claim 1, further comprising a plurality of registers storing values representative of a desired average current through the load and a desired dither amplitude, said target generator adding and subtracting said dither amplitude value from said average current value to generate sum and difference values, and alternately utilizing said sum and said difference values in said comparing step as a function of a clock signal from said sequencer.

3. The driver of claim 2, wherein said plurality of phase-shifted wave forms generated by said sequencer each have the same frequency, and wherein the frequency is user selectable from a plurality of divided system clock frequencies.

4. The driver of claim 1, wherein said sensed current signal is a voltage directly proportional to the current flowing through the load, and said sequencer minimizes spikes in said signal by staggering the time periods when at least one other driver may generate said trigger signals.

5. The driver of claim 1, further comprising:
    means for generating a short circuit detection signal responsive to said signal representative of a sensed current exceeding a programmed load current range for the driver.

6. The driver of claim 1, further comprising:
    an offset latch storing a calibration offset, said target generator supplying said target current value as a function of at least said calibration offset and said programmable value representative of a desired current.

7. An integrated circuit comprising:
    a plurality of pulse width modulation drivers, each driver having
        a target generator for supplying a target current value,
        a comparator for comparing said target current value to a signal representative of a sensed current flowing through a load, and
        a driver control for selectively generating trigger signals to switch current through the load in response to the result of said comparison; and
    a sequencer for generating a plurality of wave forms phase-shifted so as to have non-overlapping duty cycles, wherein said driver control is responsive to a duty-cycle of only one of said plurality of wave forms to generate said trigger signals.

8. The integrated circuit of claim 7, wherein said sensed current signal is a voltage directly proportional to the current flowing through the load, and said sequencer minimizes spikes in said signal by staggering the time periods when at least one other driver may generate said trigger signals.

9. A method of producing desired pulse width modulated currents through a plurality of loads, comprising the steps of:
    supplying one of a plurality of periodic wave forms to each of a plurality of pulse width modulated drivers, each wave form having the same frequency as the other said wave forms but being sequentially phase shifted to have non-overlapping duty cycles with each other said wave form; and
    selectively generating trigger signals to switch current through one of said plurality of loads in response to the result of a comparison between a target value and a sensed current said one load only during a duty cycle for one of said plurality of wave forms.

* * * * *